(12) United States Patent
Yu et al.

(10) Patent No.: US 6,458,513 B1
(45) Date of Patent: Oct. 1, 2002

(54) TEMPORARY BRIDGE FOR MICRO MACHINED STRUCTURES

(75) Inventors: Lianzhong Yu, Stafford; Howard D. Goldberg; Duli Yu, both of Sugarland, all of TX (US)

(73) Assignee: Input/Output, Inc., Stafford, TX (US)

( * ) Notice: Subject to any disclaimer, the term of this patent is extended or adjusted under 35 U.S.C. 154(b) by 0 days.

(21) Appl. No.: 09/406,158

(22) Filed: Sep. 27, 1999

Related U.S. Application Data

(63) Continuation-in-part of application No. 09/352,025, filed on Jul. 13, 1999.

(51) Int. Cl.$^7$ ................................................. G03F 7/00
(52) U.S. Cl. ..................... 430/313; 430/312; 430/314; 430/316; 216/13; 216/58
(58) Field of Search ................................. 430/312, 313, 430/314, 316; 216/13, 58

(56) References Cited

U.S. PATENT DOCUMENTS

| | | | |
|---|---|---|---|
| 5,364,497 A | 11/1994 | Chau et al. | 156/645 |
| 5,369,057 A | * 11/1994 | Lee et al. | 437/209 |
| 6,153,524 A | * 11/2000 | Henley et al. | 438/691 |

OTHER PUBLICATIONS

"Integrated Optical Sensors Using Micromechanical Bridges and Cantilevers"; Authors: Shaodong Wu and Hans J. Frankena; Publication: SPIE vol. 1793 Integrated Optics and Microstructures (1992), pp. 83–89.

"Deformation Control of Microbridges for Flow Sensors"; Authors: T. Matsuura, M. Taguchi, K. Kawata and K Tsutsumi; Publication: Sensors and Actuators A 60 (1997), pp. 197–201.

* cited by examiner

Primary Examiner—Mark F. Huff
Assistant Examiner—Nicole Barreca

(57) ABSTRACT

A micro machined structure includes one or more temporary bridges for temporarily coupling the micro machined structure to a support structure.

12 Claims, 17 Drawing Sheets

US 6,458,513 B1

TEMPORARY BRIDGE FOR MICRO MACHINED STRUCTURES

CROSS-REFERENCE TO RELATED APPLICATIONS

This application is a continuation-in-part of U.S. utility patent application Ser. No. 09/352,025, filed on Jul. 13, 1999 the disclosure of which is incorporated herein by reference.

BACKGROUND OF THE INVENTION

This invention relates to micro-machined structures and, more particularly, to methods and apparatus for manufacturing micro-machined structures.

Micro machined structures are used to provide components for use in, for example, strain gauges, accelerometers, and gyroscopes. Typically such components are manufactured by micro machining a silicon substrate using a sequence of photolithographic processes including the steps of masking and etching preselected sections of the silicon substrate to produce a three dimensional structure. The three dimensional structures produced from the silicon substrate are often extremely fragile and can easily become damaged during the manufacturing process.

The present invention is directed to overcoming or at least minimizing the limitations of the conventional manufacturing processes for producing micro machined structures.

SUMMARY OF THE INVENTION

According to one aspect of the present invention, a micro machined apparatus is provided that includes a support structure, one or more temporary bridges coupled to the support structure, and a mass coupled to the temporary bridge.

According to another aspect of the present invention, a method of manufacturing a micro machined apparatus is provided that includes micro machining a support structure coupled to a mass using one or more temporary bridges in a substrate and severing the temporary bridges.

According to another aspect of the present invention, a method of fabricating a micro machined structure is provided that includes providing a top silicon wafer and a bottom silicon wafer, forming a cavity in the bottom surface of the top silicon wafer, bonding the top silicon wafer onto the bottom silicon wafer, etching a portion of the top surface of the top silicon wafer, and micro machining a three dimensional structure in the portion of the top silicon wafer above the cavity having one or more temporary bridges for coupling the three dimensional structure to the remaining portions of the top silicon wafer.

According to another aspect of the present invention, a method of fabricating a micro machined structure is provided that includes providing a top silicon wafer and a bottom silicon wafer, forming a cavity in the top surface of the bottom silicon wafer, bonding the top silicon wafer onto the bottom silicon wafer, etching a portion of the top surface of the top silicon wafer and micro machining a three dimensional structure in the portion of the top silicon wafer above the cavity having one or more temporary bridges for coupling the three dimensional structure to the remaining portions of the top silicon wafer.

According to another aspect of the present invention, a method of fabricating a micro machined structure is provided that includes providing a top silicon wafer having an internal layer of silicon dioxide and a bottom silicon wafer, forming a cavity in the bottom surface of the top silicon wafer, bonding the top silicon wafer onto the bottom silicon wafer, etching a portion of the top surface of the top silicon wafer, and micro machining a three dimensional structure in the portion of the top silicon wafer above the cavity having one or more temporary bridges for coupling the three dimensional structure to the remaining portions of the top silicon wafer.

According to another aspect of the present invention, a method of fabricating a micro machined structure is provided that includes providing a top silicon wafer having an internal layer of silicon dioxide and a bottom silicon wafer, forming a cavity in the top surface of the bottom silicon wafer, bonding the top silicon wafer onto the bottom silicon wafer, etching a portion of the top surface of the top silicon wafer, and micro machining a three dimensional structure in the portion of the top silicon wafer above the cavity having one or more temporary bridges for coupling the three dimensional structure to the remaining portions of the top silicon wafer.

According to another aspect of the present invention, a method of manufacturing a device including a micro machined structure is provided that includes temporarily coupling the micro machined structure to a support structure using one or more temporary bridges, decoupling the micro machined structure from the support structure by severing the temporary bridges and coupling the micro machined structure to a substrate.

According to another aspect of the present invention, a method of protecting a resilient coupling for coupling a mass to a support structure is provided that includes coupling the mass to the support structure using the resilient coupling and one or more temporary bridges and severing the temporary bridges.

BRIEF DESCRIPTION OF THE DRAWINGS

FIG. 1b is a cross-sectional of the temporary bridge of FIG. 1a.

FIG. 1d is a top view of an alternative embodiment of the temporary bridge of FIG. 1a.

FIG. 1e is a top view of another alternative embodiment of the temporary bridge of FIG 1a.

FIG. 2b is a cross-sectional of the temporary bridge of FIG. 2a.

DETAILED DESCRIPTION OF THE ILLUSTRATIVE EMBODIMENTS

A temporary bridge is provided for coupling a micro machined structure to a support structure. In one embodiment, the temporary bridge is used to temporarily couple the micro machined structure to the support structure. In this manner, the micro machined structure is temporarily coupled to the support structure until decoupled. In another application, the temporary bridge prevents the decoupling of the micro machined structure from the support structure. In this manner, the micro machined structure is protected from decoupling from the support structure by the additional structural support provided by the temporary bridge.

Figure 1A:
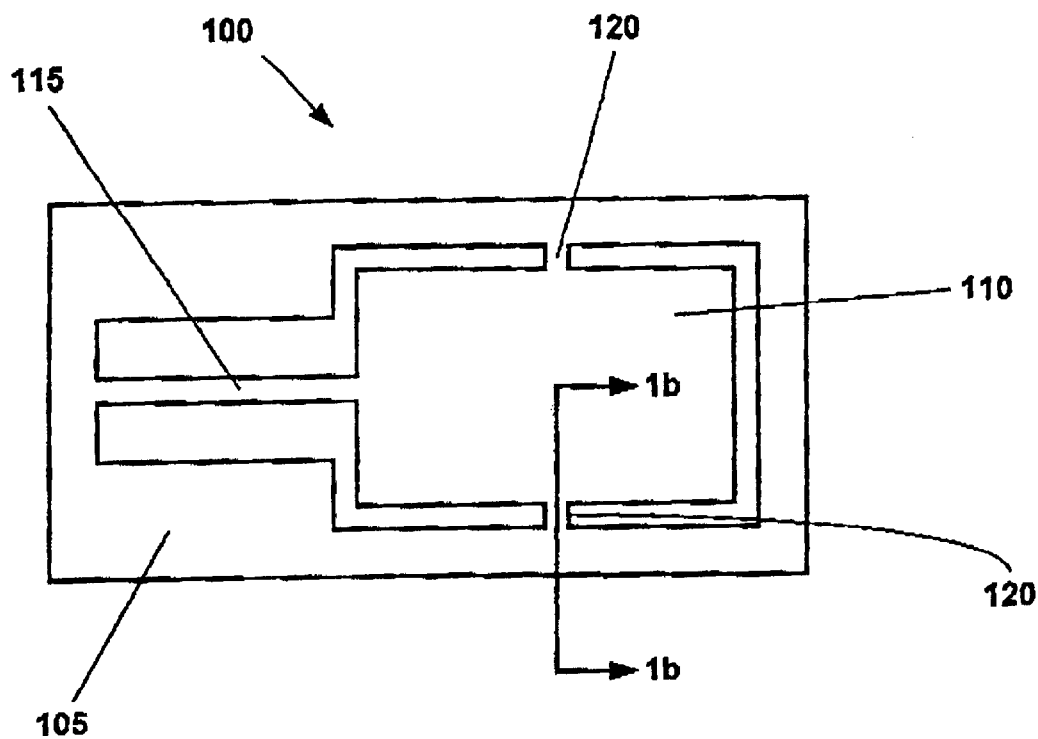
FIG. 1a is an illustration of an embodiment of a micro machined structure including a temporary bridge.
Figure 1B:
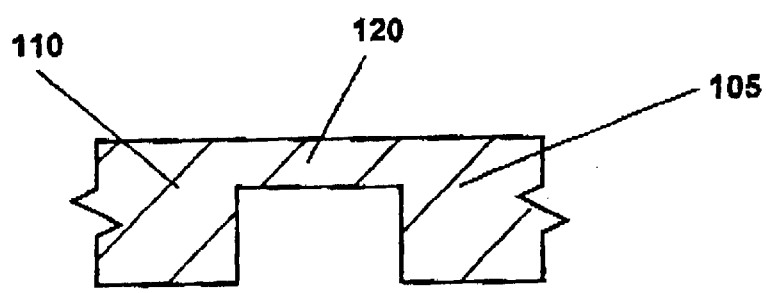

Referring initially to FIGS. 1a and 1b, an embodiment of a micro machined element 100 preferably includes a support structure 105, a mass 110, a resilient coupling 115, and one or more temporary bridges 120.

The support structure 105 is coupled to the resilient coupling 115 and the temporary bridges 120. The support structure 105 is preferably adapted to support the resilient coupling 115 and the temporary bridges 120.

The mass 110 is coupled to the resilient coupling 115 and the temporary bridges 120.

The resilient coupling 115 is coupled to the support structure 105 and the mass 110. The resilient coupling 115 is preferably adapted to resiliently support the mass 110.

In a preferred embodiment, the mass 110 and resilient coupling 115 are further adapted in a conventional manner to provide a spring-mass system for use in a conventional accelerometer.

The temporary bridges 120 are coupled to the support structure 105 and the mass 110. The temporary bridges 120 are preferably adapted to temporarily support the mass 110 until the temporary bridges 120 are severed during the manufacturing process. In this manner, the temporary bridges 120 prevent damage to the resilient coupling 115 during the manufacturing process. In a preferred embodiment, upon the conclusion of the manufacturing process, the temporary bridges 120 are severed and the mass 110 is supported solely by the resilient coupling 115.

Figure 1C:
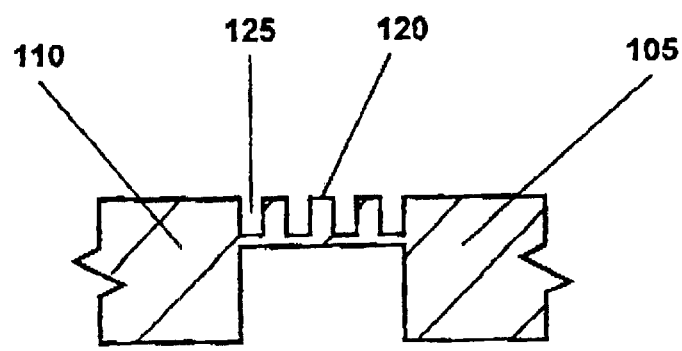
FIG. 1c is a cross-sectional illustration of an alternative embodiment of the temporary bridge of FIG. 1b.
Figure 1D:
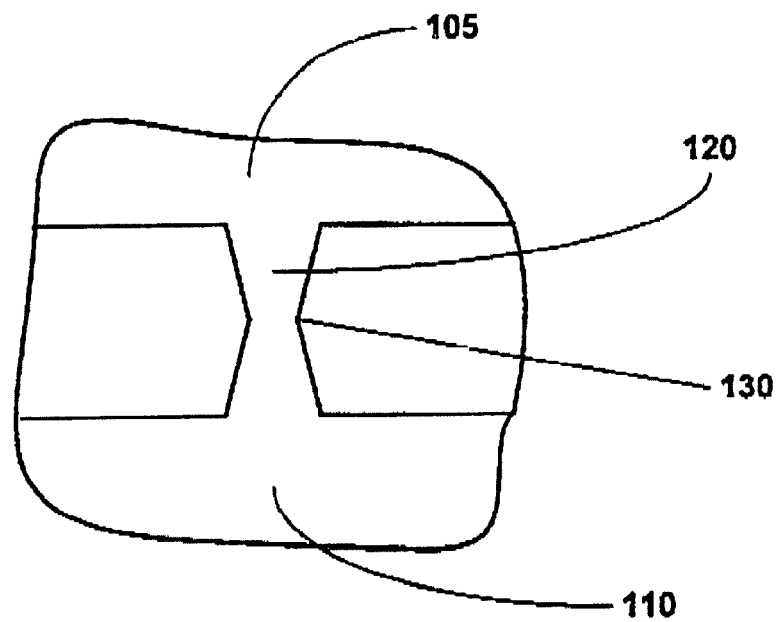
Figure 1E:
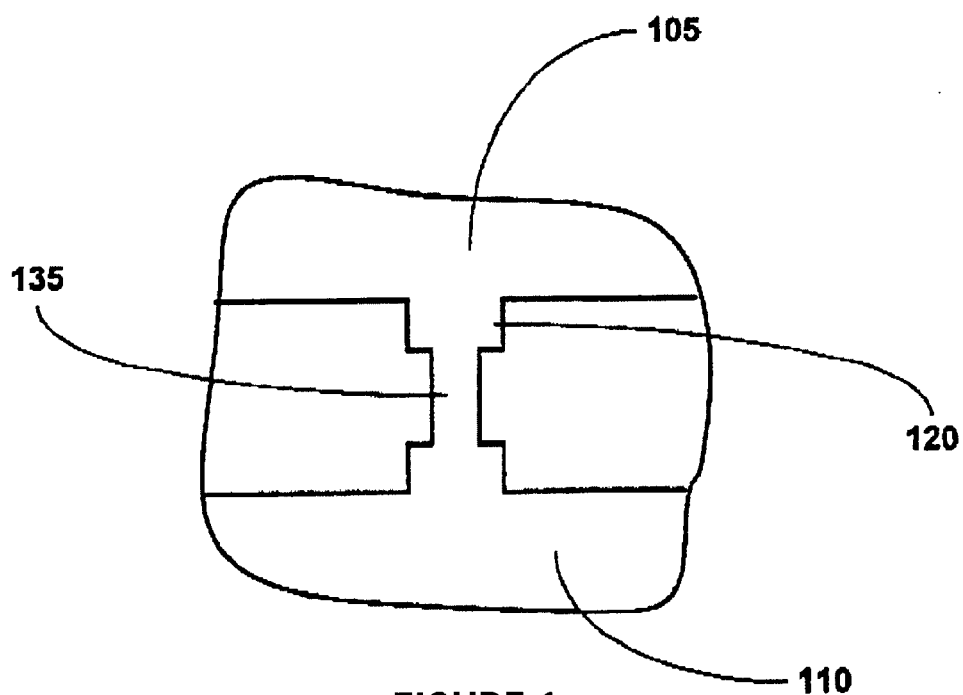

In a preferred embodiment, as illustrated in FIG. 1b, the thickness of the temporary bridge 120 is less than the thicknesses of the support structure 105 and the mass 110. In a preferred embodiment, the thickness of the temporary bridge 120 is about 1 to 10% of the thickness of the thicknesses of the support structure 105 and the mass 110. In a preferred embodiment, the thickness of the temporary bridge 120 is less than about 50 microns. In this manner, the structural support of the temporary bridge 120 is maximized while the force required to sever the temporary bridge 120 is minimized. In an alternative embodiment, as illustrated in FIG. 1c, the temporary bridge 120 includes one or more cavities 125 in order to further minimize the force required to sever the temporary bridge 120. In another alternative embodiment, as illustrated in FIG. 1d, the temporary bridge 120 includes a tapered portion 130 having reduced width in order to further minimize the force required to sever the temporary bridge 120. In another alternative embodiment, as illustrated in FIG. 1e, the temporary bridge 120 includes a region 135 of reduced width in order to further minimize the force required to sever the temporary bridge 120.

In a preferred embodiment, the micro machined element 100 is fabricated from a silicon wafer using one or more of the merged-mask micro machining processes disclosed in U.S. utility patent application Ser. No. 09/352,025, attorney docket number 14737.659.3, filed on Jul. 13, 1999, the disclosure of which is incorporated herein by reference.

Figure 2A:
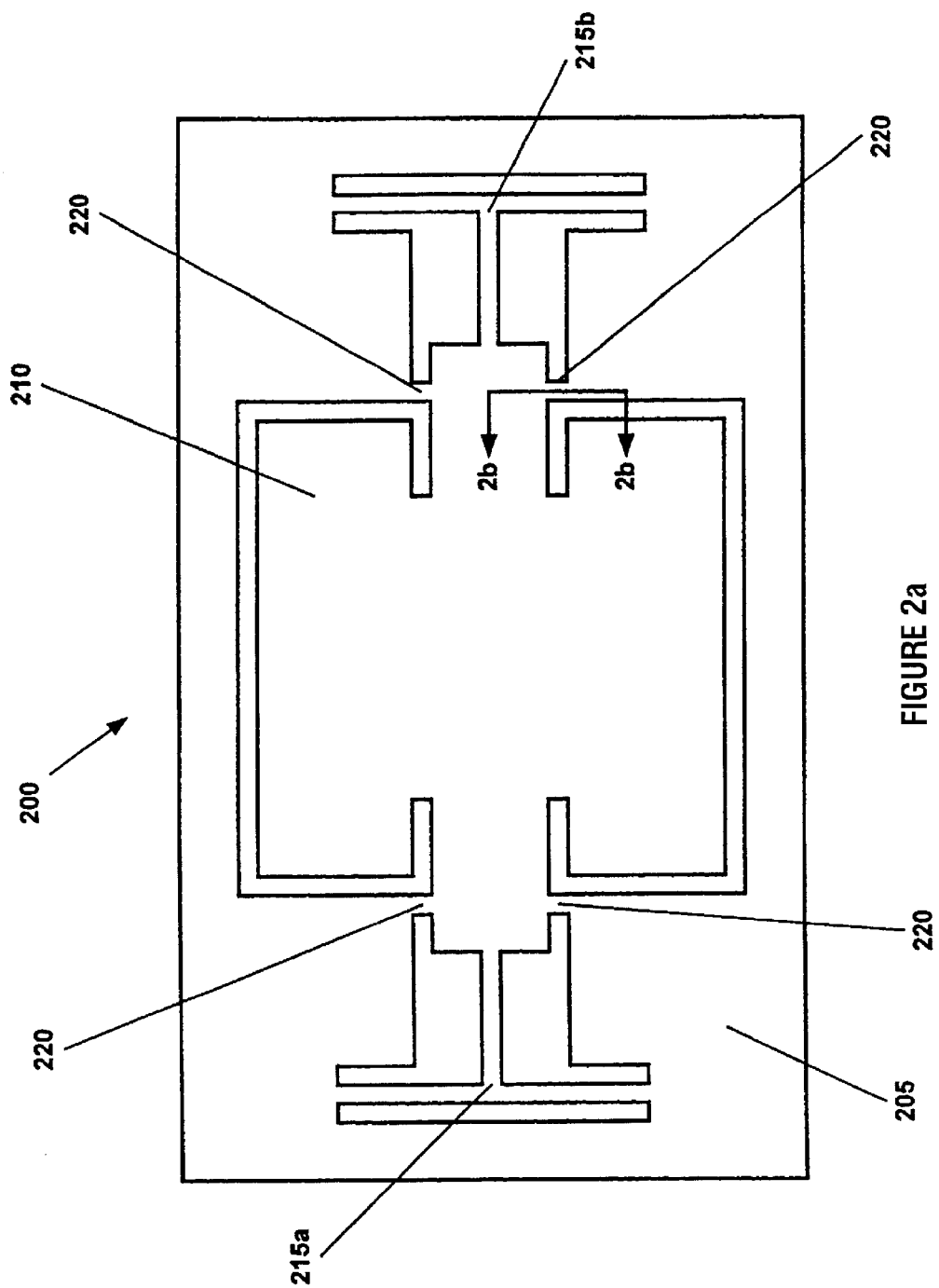
FIG. 2a is an illustration of another embodiment of a micro machined structure including a temporary bridge.
Figure 2B:
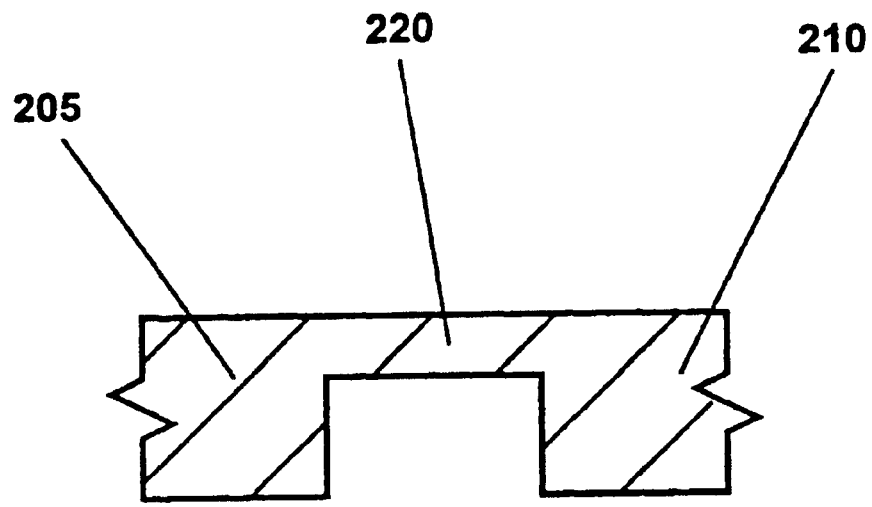

Referring to FIGS. 2a and 2b, an alternative embodiment of a micro machined element 200 preferably includes a support structure 205, a mass 210, resilient couplings 215a and 215b, and one or more temporary bridges 220.

The support structure 205 is coupled to the resilient couplings 215a and 215b and the temporary bridges 120. The support structure 205 is preferably adapted to support the resilient couplings 215a and 215b and the temporary bridges 120.

The mass 210 is coupled to the resilient couplings 215a and 215b and the temporary bridges 220.

The resilient couplings 215a and 215b are coupled to the support structure 205 and the mass 210. The resilient couplings 215a and 215b are preferably adapted to resiliently support the mass 210. In a preferred embodiment, the resilient couplings 215a and 215b are T-shaped resilient hinges.

In a preferred embodiment, the mass 210 and resilient couplings 215a and 215b are further adapted to provide a rotating mirror for use in a bar code scanning system as disclosed in U.S. utility patent application Ser. No. 09/352,025, attorney docket number 14737.659.3, filed on Jul. 13, 1999, the disclosure of which is incorporated herein by reference.

The temporary bridges 220 are coupled to the support structure 205 and the mass 210. The temporary bridges 220 are preferably adapted to temporarily support the mass 210 until the temporary bridges 220 are severed during the manufacturing process. In this manner, the temporary bridges 220 prevent damage to the resilient couplings 215a and 215b during the manufacturing process. In a preferred embodiment, upon the conclusion of the manufacturing process, the temporary bridges 220 are severed and the mass 210 is supported solely by the resilient couplings 215a and 215b.

Figure 2C:
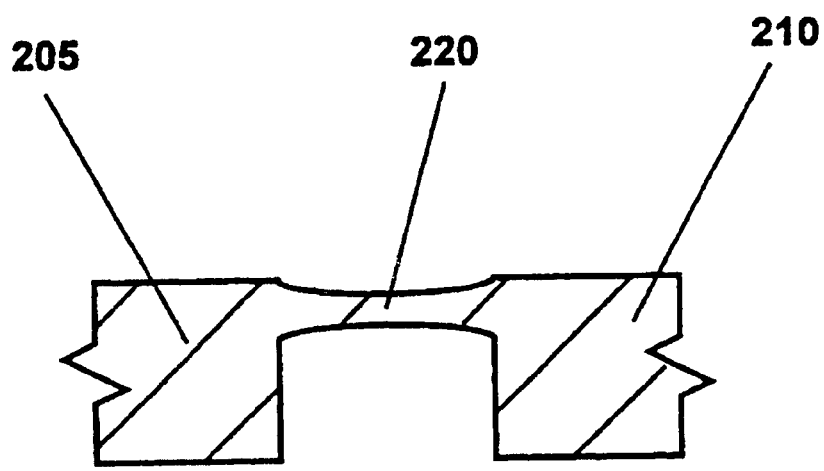
FIG. 2c is a cross-sectional illustration of an alternative embodiment of the temporary bridge of FIG. 2b.

In a preferred embodiment, as illustrated in FIG. 2b, the thickness of the temporary bridge 220 is less than the thicknesses of the support structure 205 and the mass 210. In a preferred embodiment, the thickness of the temporary bridge 220 is about 1 to 10% of the thickness of the thicknesses of the support structure 205 and the mass 210. In a preferred embodiment, the thickness of the temporary bridge 220 is less than about 50 microns. In this manner, the structural support of the temporary bridge 220 is maximized while the force required to sever the temporary bridge 220 is minimized. In an alternative embodiment, as illustrated in FIG. 2c, the temporary bridge 220 is tapered in order to further minimize the force required to sever the temporary bridge 220.

In a preferred embodiment, the micro machined element 200 is fabricated from a silicon wafer using one or more of the merged-mask micro machining processes disclosed in U.S. utility patent application Ser. No. 09/352,025, attorney docket number 14737.659.3, filed on Jul. 13, 1999, the disclosure of which is incorporated herein by reference.

In a preferred embodiment, the micro machined element 200 is coupled to a top cap and a bottom cap, as described in U.S. utility patent application Ser. No. 09/352,025, attorney docket number 14737.659.3, filed on Jul. 13, 1999, the disclosure of which is incorporated herein by reference, prior to severing the temporary bridges 220. In this manner, the mass 210 is optimally protected from shock and damage during the subsequent steps of the manufacturing process.

Figure 3:
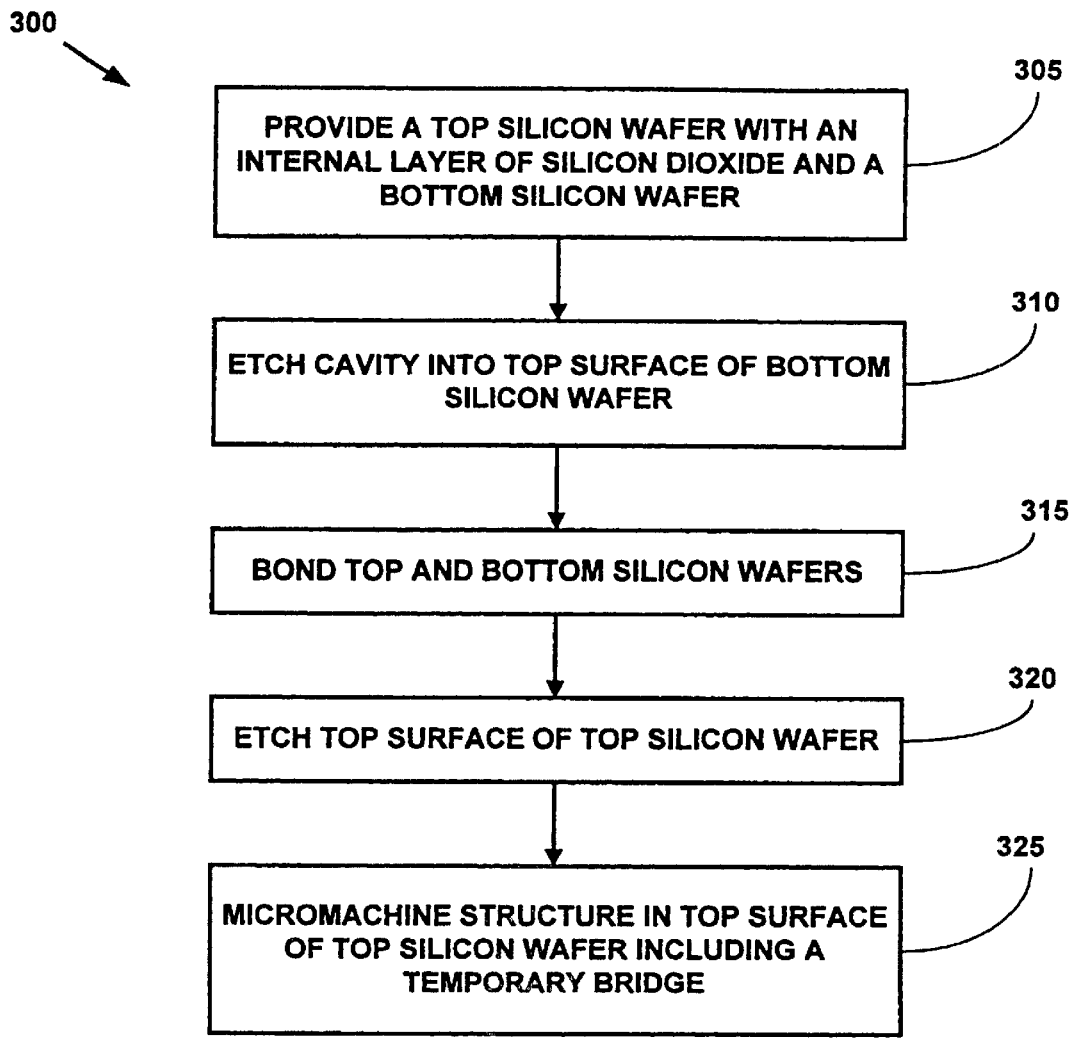
FIG. 3 is an illustration of an embodiment of a method for fabricating a micro machined structure coupled to a support structure using one or more temporary bridges.

Referring to FIG. 3, a preferred embodiment of a method 300 for manufacturing a micro machined structure having one or more temporary bridges includes the steps of: (1) providing a top silicon wafer with an internal layer of silicon dioxide and a bottom silicon wafer in step 305; (2) etching one or more cavities in the top surface of the bottom silicon wafer in step 310; (3) bonding the top silicon wafer onto the bottom silicon wafer in step 315; (4) etching the top surface of the top silicon wafer in step 320; and (5) micro machining the top surface of the top silicon wafer to form a three dimensional structure including one or more temporary bridges in step 325.

Figure 4A:
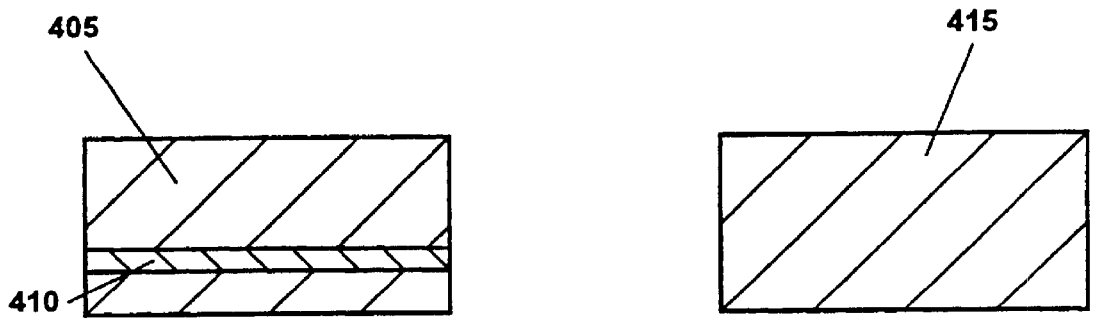
FIG. 4a is a cross sectional illustration of the fabrication of a top silicon wafer including an internal layer of silicon dioxide and a bottom silicon wafer.

As illustrated in FIG. 4a, in a preferred embodiment, in step 305, a top wafer 405 of silicon having an internal layer 410 of silicon dioxide and a bottom wafer 415 of silicon are provided. In a preferred embodiment, the top wafer 405 of silicon is a silicon on insulator (SOI) wafer. In a preferred embodiment, the internal layer 410 of silicon dioxide is positioned about 5 to 50 microns above the bottom surface of the top wafer 405 of silicon.

Figure 4B:
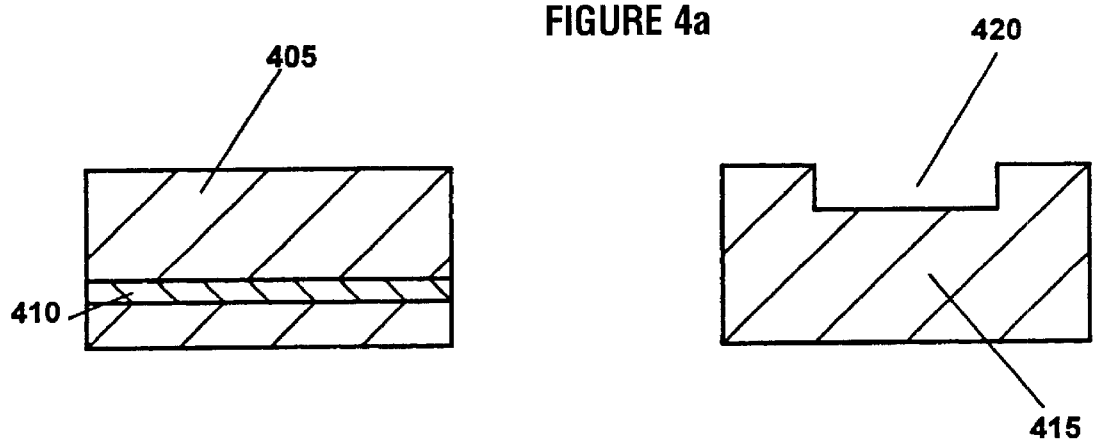
FIG. 4b. is a cross sectional illustration of the top and bottom silicon wafers of FIG. 4a after etching a cavity in the top surface of the bottom silicon wafer.

As illustrated in FIG. 4b, in a preferred embodiment, in step 310, a cavity 420 is etched in the top surface of the bottom wafer 415 of silicon. The cavity 420 may have any number of cross-sectional shapes. In a preferred embodiment, the cavity 420 has a substantially rectangular cross sectional shape.

Figure 4C:
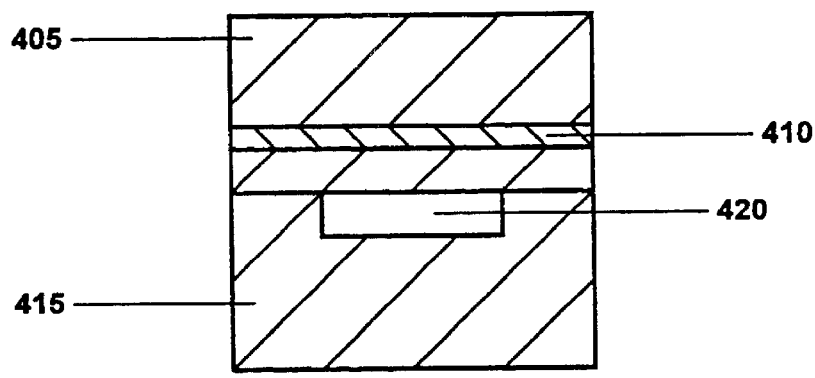
FIG. 4c is a cross sectional illustration of the top and bottom silicon wafers of FIG. 4b after bonding the top silicon wafer onto the bottom silicon wafer.

As illustrated in FIG. 4c, in a preferred embodiment, in step 315, the top wafer 405 of silicon is bonded onto the bottom wafer 415 of silicon. The top wafer 405 of silicon may be bonded to the bottom wafer 415 of silicon using any number of conventional processes for bonding wafers of silicon. In a preferred embodiment, the top wafer 405 of silicon is bonded to the bottom wafer 415 of silicon using the process of silicon fusion bonding.

Figure 4D:
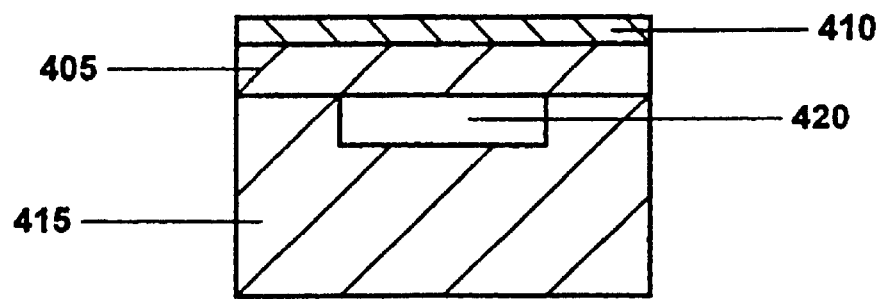
FIG. 4d is a cross sectional illustration of the top and bottom silicon wafers of FIG. 4c after etching the exposed portions of the top silicon wafer down to the internal layer of silicon dioxide.
Figure 4E:
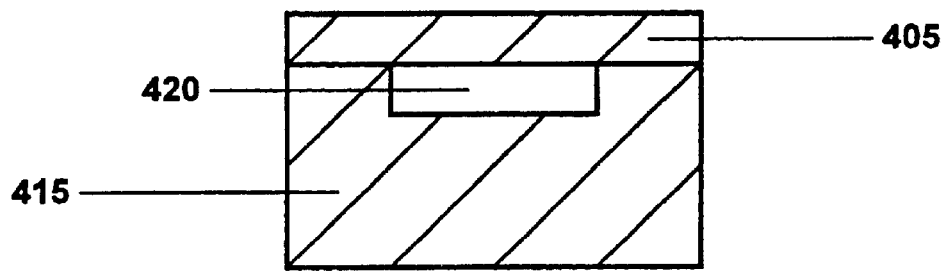
FIG. 4e is a cross sectional illustration of the top and bottom silicon wafers of FIG. 4d after etching the internal layer of silicon dioxide of the top silicon wafer.

As illustrated in FIGS. 4d and 4e, in a preferred embodiment, in step 320, the exposed portions of the top wafer 405 and the internal layer 410 of silicon dioxide are etched. In a preferred embodiment, the exposed portions of the top wafer 405 and the internal layer 410 of silicon dioxide are etched using a conventional KOH etching process. In a preferred embodiment, the internal layer 410 of silicon dioxide is used as an etch stop during the etching process. In a preferred embodiment, the thickness of the top wafer 405 after the etching process ranges from about 5 to 50 microns.

Figure 4F:
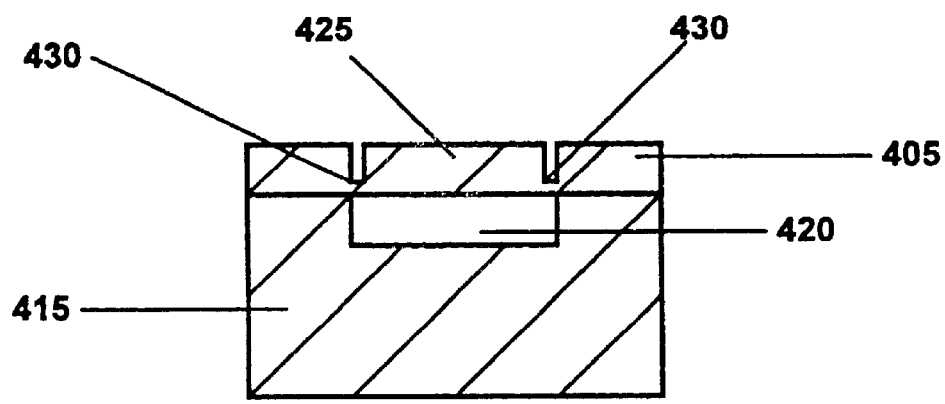
FIG. 4f is a cross sectional illustration of the top and bottom silicon wafers of FIG. 4e after micro machining the top silicon wafer to generate a micro machined structure that is coupled to the remaining portions of the top silicon wafer by one or more temporary bridges.
Figure 4G:
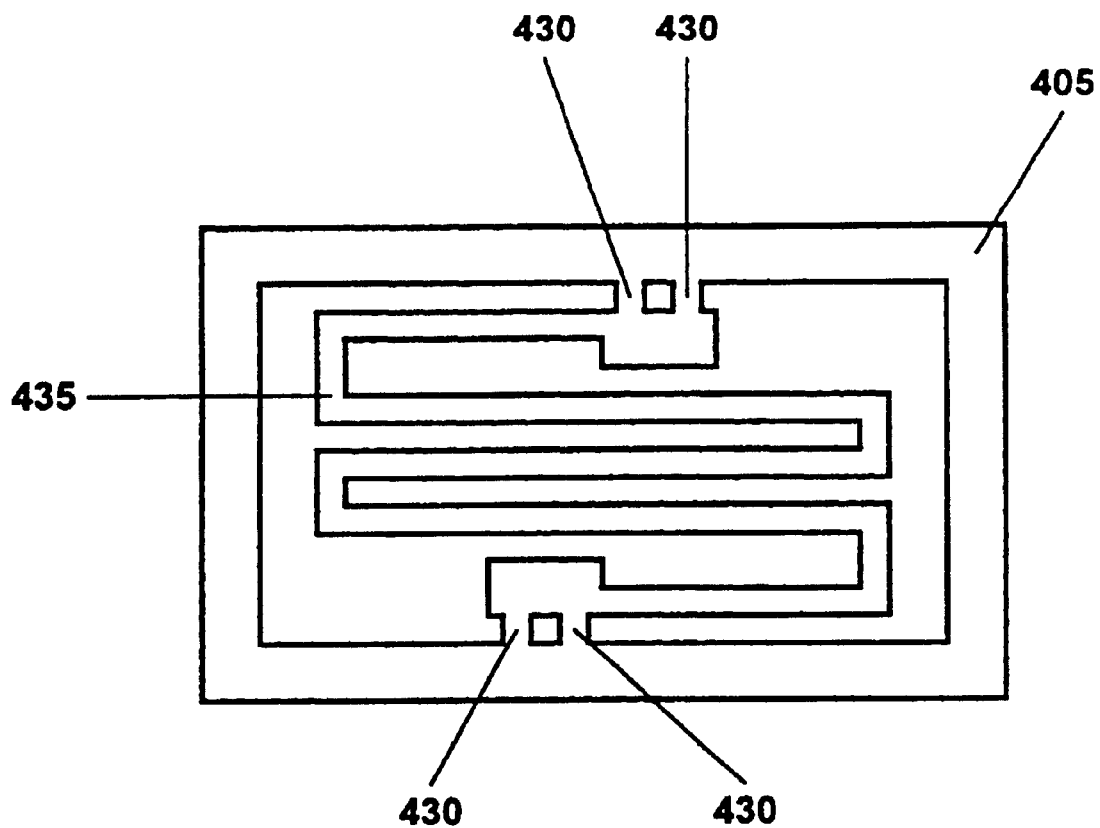
FIG. 4g is a top view of a preferred embodiment of the micro machined structure of FIG. 4f.

As illustrated in FIG. 4f, in a preferred embodiment, in step 325, a three dimensional structure 425 is micro machined in the top wafer 405 of silicon above the cavity 420 in the bottom wafer 415 of silicon. In a preferred embodiment, the structure 425 is coupled to the remaining portions of the top wafer 405 of silicon by one or more temporary bridges 430. In a preferred embodiment, as illustrated in FIG. 4g, the structure 425 is a strain gauge 435. In a preferred embodiment, the structure 425 and the temporary bridges 430 are formed using one or more of the merged-mask micro machining processes disclosed in U.S. utility patent application Ser. No. 09/352,025, attorney docket number 14737.659.3, filed on Jul. 13, 1999, the disclosure of which is incorporated herein by reference.

In a preferred embodiment, the structure 425 is coupled to remaining portions of the top wafer 405 of silicon by the temporary bridges 430. The structure 425 is then preferably decoupled from the top wafer 405 of silicon by severing the temporary bridges 430. In this manner, the structure 425 is protected from damage prior to subsequent manufacturing operations. In a preferred embodiment, the temporary bridges 430 are severed by removing the structure 425 from the top wafer 405 of silicon using a conventional robotic arm. In an exemplary embodiment, the structure 425 is a strain gauge 435 that is decoupled from the top wafer 405 of silicon and subsequently bonded to a substrate and wire bonded.

Figure 5:
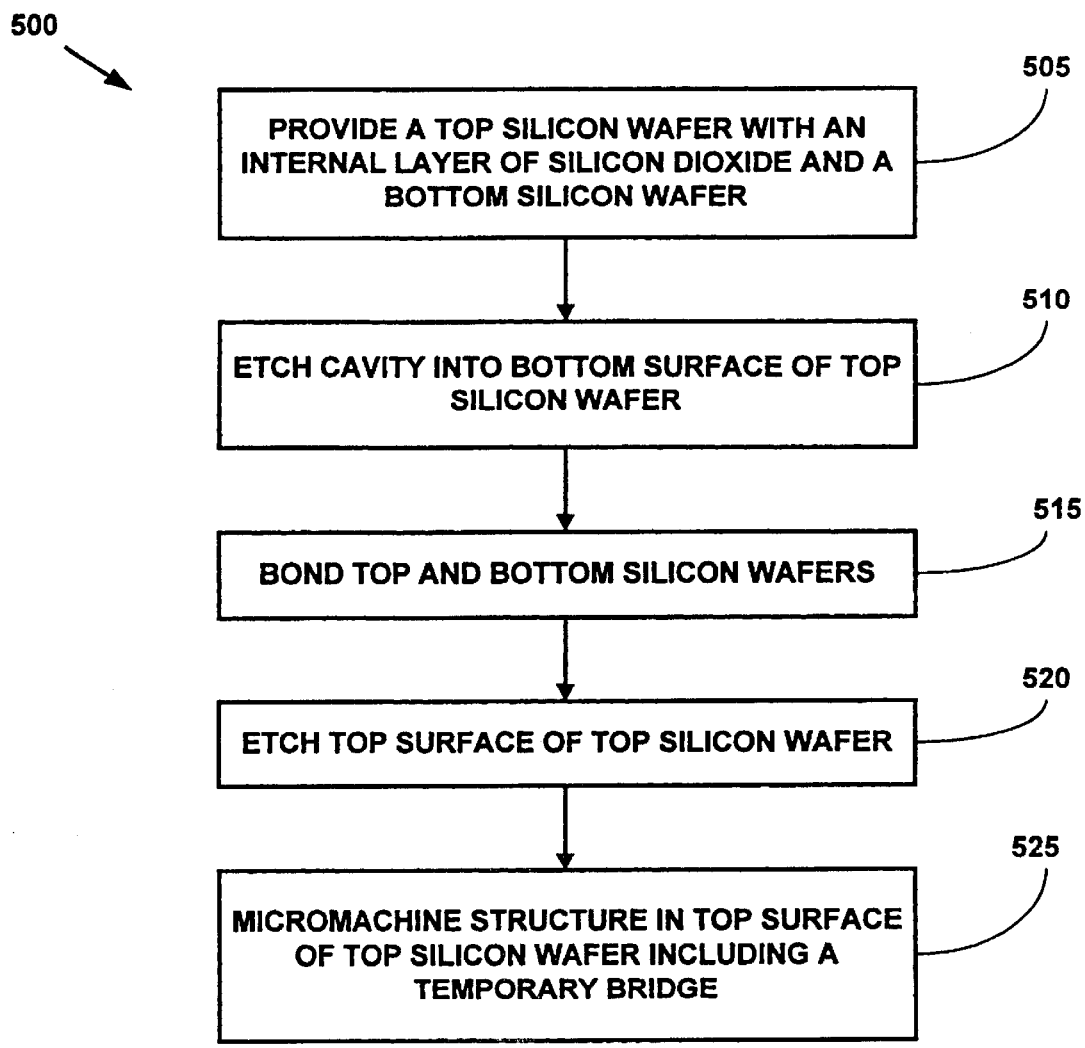
FIG. 5 is an illustration of another embodiment of a method for fabricating a micro machined structure coupled to a support structure using one or more temporary bridges.

Referring to FIG. 5, an alternative preferred embodiment of a method 500 for manufacturing a micro machined structure having one or more temporary bridges includes the steps of: (1) providing a top silicon wafer with an internal layer of silicon dioxide and a bottom silicon wafer in step 505; (2) etching one or more cavities in the bottom surface of the top silicon wafer in step 510; (3) bonding the top silicon wafer onto the bottom silicon wafer in step 515; (4) etching the top surface of the top silicon wafer in step 520; and (5) micro machining the top surface of the top silicon wafer to form a three dimensional structure including one or more temporary bridges in step 525.

Figure 6A:
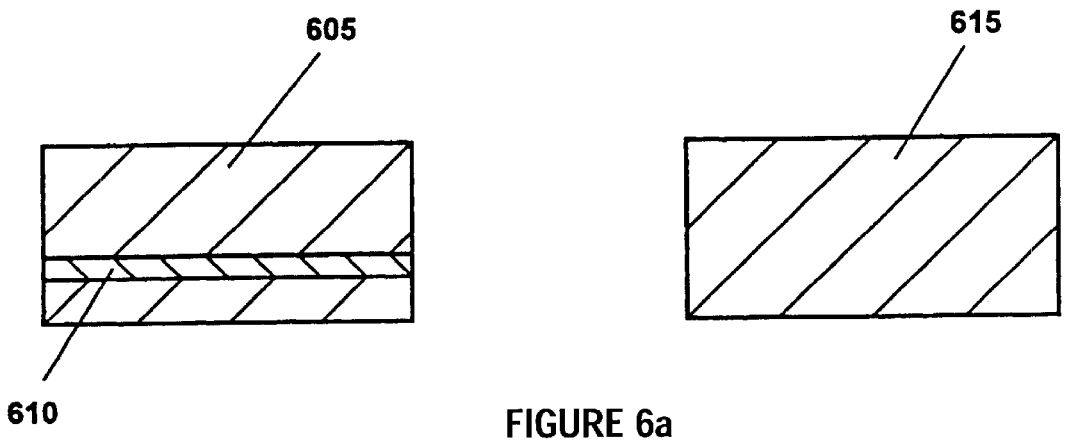
FIG. 6a is a cross sectional illustration of the fabrication of a top silicon wafer including an internal layer of silicon dioxide and a bottom silicon wafer.

As illustrated in FIG. 6a, in a preferred embodiment, in step 505, a top wafer 605 of silicon having an internal layer 610 of silicon dioxide and a bottom wafer 615 of silicon are provided. In a preferred embodiment, the top wafer 605 of silicon is an SOI wafer. In a preferred embodiment, the internal layer 610 of silicon dioxide is positioned about 5 to 50 microns above the bottom surface of the top wafer 605 of silicon.

Figure 6B:
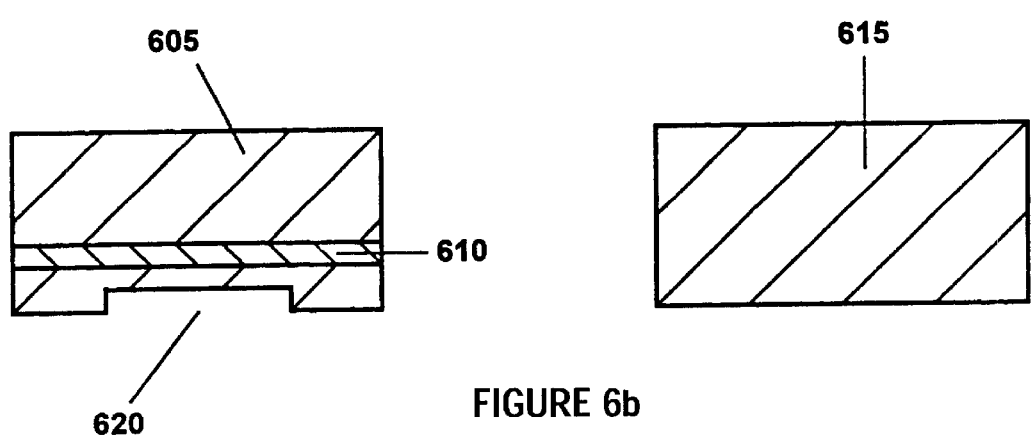
FIG. 6b. is a cross sectional illustration of the top and bottom silicon wafers of FIG. 6a after etching a cavity in the bottom surface of the top silicon wafer.

As illustrated in FIG. 6b, in a preferred embodiment, in step 510, a cavity 620 is etched in the bottom surface of the top wafer 605 of silicon. The cavity 620 may have any number of cross-sectional shapes. In a preferred embodiment, the cavity 620 has a substantially rectangular cross sectional shape.

Figure 6C:
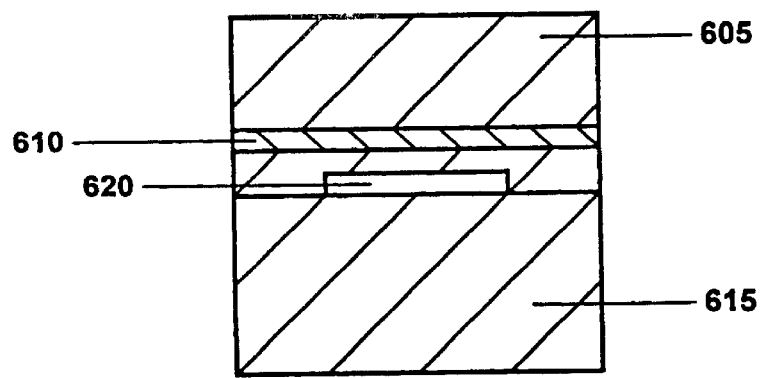
FIG. 6c is a cross sectional illustration of the top and bottom silicon wafers of FIG. 6b after bonding the top silicon wafer onto the bottom silicon wafer.

As illustrated in FIG. 6c, in a preferred embodiment, in step 515, the top wafer 605 of silicon is bonded onto the bottom wafer 615 of silicon. The top wafer 605 of silicon may be bonded to the bottom wafer 615 of silicon using any number of conventional processes for bonding wafers of silicon. In a preferred embodiment, the top wafer 605 of silicon is bonded to the bottom wafer 615 of silicon using the process of silicon fusion bonding.

Figure 6D:
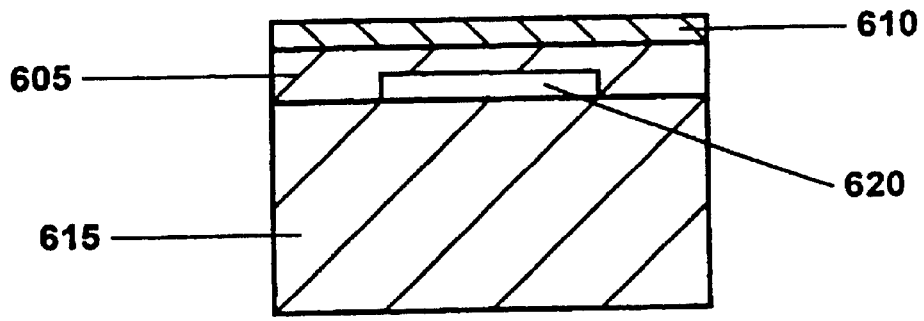
FIG. 6d is a cross sectional illustration of the top and bottom silicon wafers of FIG. 6c after etching the exposed portions of the top silicon wafer down to the internal layer of silicon dioxide.
Figure 6E:
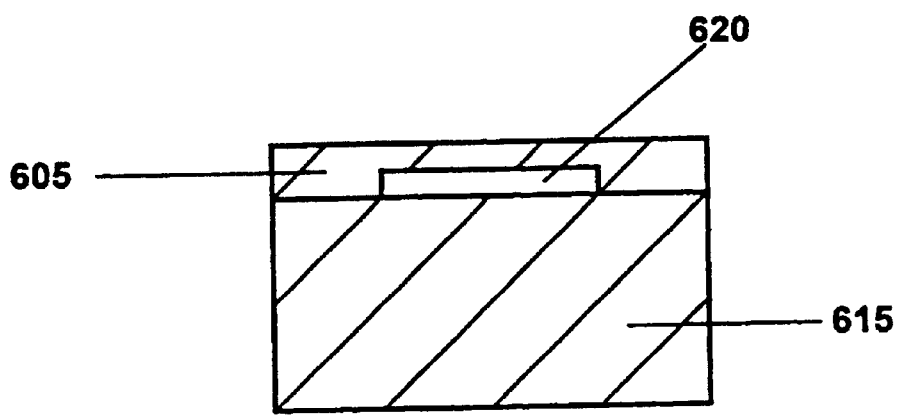
FIG. 6e is a cross sectional illustration of the top and bottom silicon wafers of FIG. 6d after etching the internal layer of silicon dioxide of the top silicon wafer.

As illustrated in FIGS. 6d and 6e, in a preferred embodiment, in step 520, the exposed portions of the top wafer 605 and the internal layer 610 of silicon dioxide are etched. In a preferred embodiment, the exposed portions of the top wafer 605 and the internal layer 610 of silicon dioxide are etched using a conventional KOH etching process. In a preferred embodiment, the internal layer 610 of silicon dioxide is used as an etch stop during the etching process. In a preferred embodiment, the thickness of the portion of the top wafer 605 of silicon above the cavity 620 after the completion of the etching process ranges from about 5 to 50 microns.

Figure 6F:
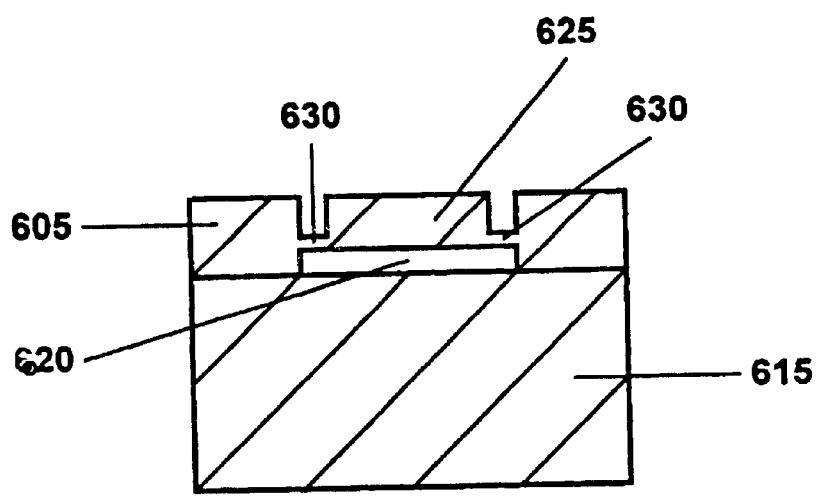
FIG. 6f is a cross sectional illustration of the top and bottom silicon wafers of FIG. 6e after micro machining the top silicon wafer to generate a micro machined structure that is coupled to the remaining portions of the top silicon wafer by one or more temporary bridges.

As illustrated in FIG. 6f, in a preferred embodiment, in step 525, a three dimensional structure 625 is micro machined in the top wafer 605 of silicon above the cavity 620 in the bottom surface of the top wafer 605 of silicon. In a preferred embodiment, the structure 625 is coupled to the remaining portions of the top wafer 605 of silicon by one or more temporary bridges 630.

In a preferred embodiment, the structure 625 and the temporary bridges 630 are formed using one or more of the merged-mask micro machining processes disclosed in U.S. utility patent application Ser. No. 09/352,025, attorney docket number 14737.659.3, filed on Jul. 13, 1999, the disclosure of which is incorporated herein by reference.

In a preferred embodiment, the structure 625 is coupled to remaining portions of the top wafer 605 of silicon by the temporary bridges 630. The structure 625 is then preferably decoupled from the top wafer 605 of silicon by severing the temporary bridges 630. In this manner, the structure 625 is protected from damage prior to subsequent manufacturing operations. In an exemplary embodiment, the structure 625 is a strain gauge that is decoupled from the top wafer 605 of silicon and subsequently bonded to a substrate and wire bonded.

Figure 7:
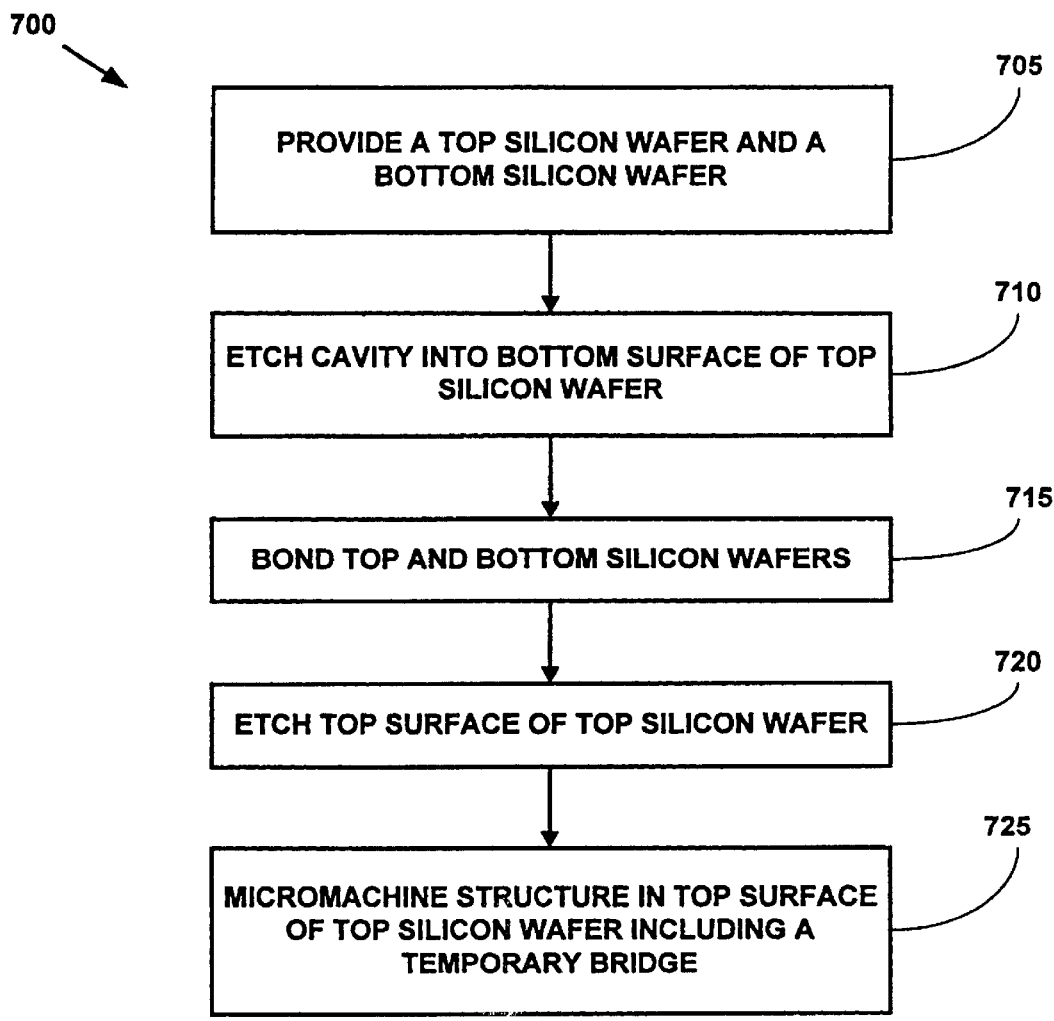
FIG. 7 is an illustration of another embodiment of a method for fabricating a micro machined structure coupled to a support structure using one or more temporary bridges.

Referring to FIG. 7, an alternative preferred embodiment of a method 700 for manufacturing a micro machined structure having one or more temporary bridges includes the steps of: (1) providing a top silicon wafer and a bottom silicon wafer in step 705; (2) etching one or more cavities in the bottom surface of the top silicon wafer in step 710; (3) bonding the top silicon wafer onto the bottom silicon wafer in step 715; (4) etching the top surface of the top silicon wafer in step 720; and (5) micro machining the top surface of the top silicon wafer to form a three dimensional structure including one or more temporary bridges in step 725.

Figure 8A:
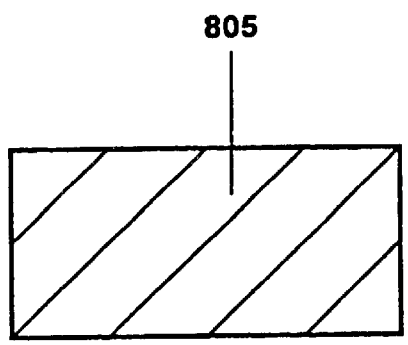
FIG. 8a is a cross sectional illustration of the fabrication of a top silicon wafer and a bottom silicon wafer.
Figure 8A:
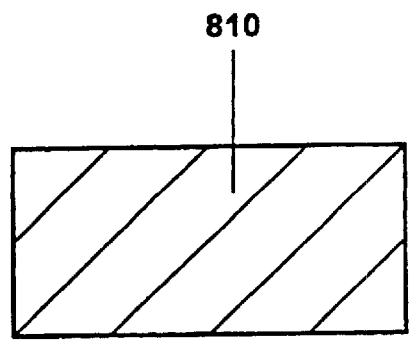

As illustrated in FIG. 8a, in a preferred embodiment, in step 705, a top wafer 805 of silicon and a bottom wafer 810 of silicon are provided.

Figure 8B:
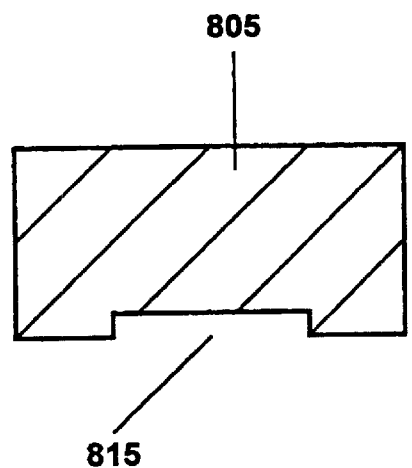
FIG. 8b. is a cross sectional illustration of the top and bottom silicon wafers of FIG. 8a after etching a cavity in the bottom surface of the top silicon wafer.
Figure 8B:
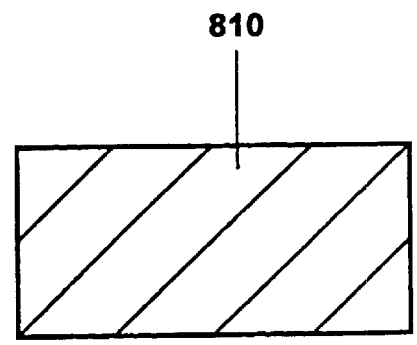

As illustrated in FIG. 8b, in a preferred embodiment, in step 710, a cavity 815 is etched in the bottom surface of the top wafer 805 of silicon. The cavity 815 may have any number of cross-sectional shapes. In a preferred embodiment, the cavity 815 has a substantially rectangular cross sectional shape.

Figure 8C:
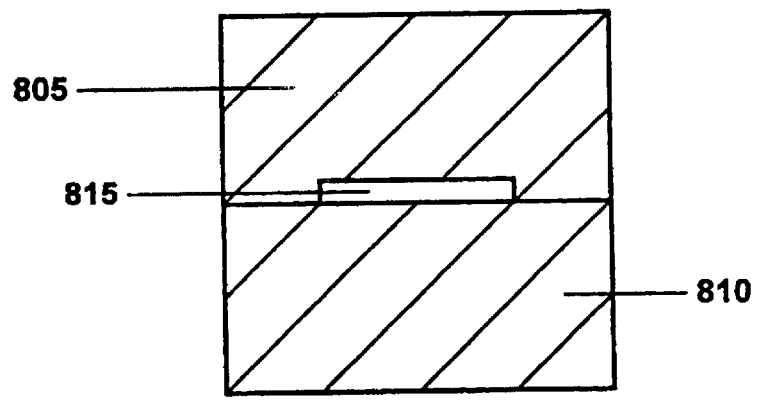
FIG. 8c is a cross sectional illustration of the top and bottom silicon wafers of FIG. 8b after bonding the top silicon wafer onto the bottom silicon wafer.

As illustrated in FIG. 8c, in a preferred embodiment, in step 715, the top wafer 805 of silicon is bonded onto the bottom wafer 810 of silicon. The top wafer 805 of silicon may be bonded to the bottom wafer 810 of silicon using any number of conventional processes for bonding wafers of silicon. In a preferred embodiment, the top wafer 805 of silicon is bonded to the bottom wafer 810 of silicon using the process of silicon fusion bonding.

Figure 8D:
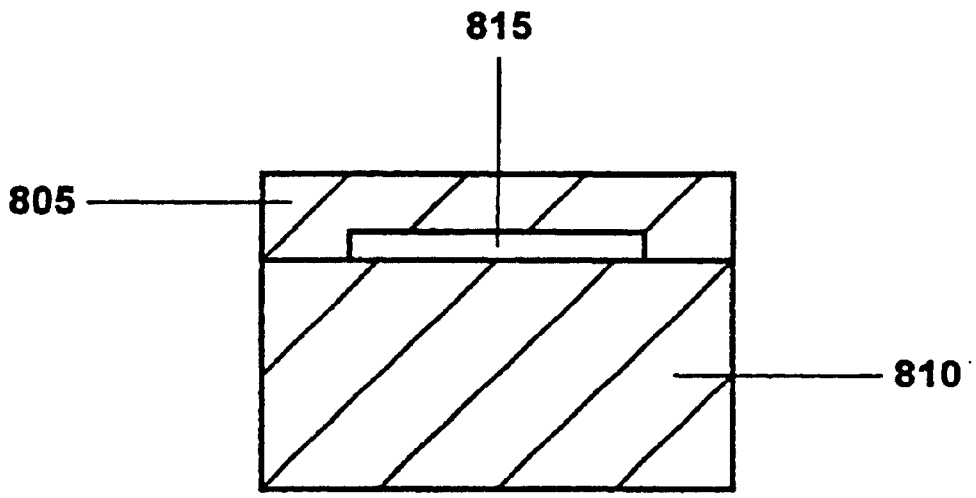
FIG. 8d is a cross sectional illustration of the top and bottom silicon wafers of FIG. 8c after etching the exposed portions of the top silicon wafer to a predetermined depth.

As illustrated in FIG. 8d, in a preferred embodiment, in step 720, the exposed portions of the top wafer 805 are etched. In a preferred embodiment, the exposed portions of the top wafer 805 of silicon are etched using a conventional wet etching process, dry etching process or a wafer polishing process. In a preferred embodiment, the thickness of the top wafer 805 of silicon above the cavity 815 after the completion of the etching process ranges from about 5 to 50 microns.

Figure 8E:
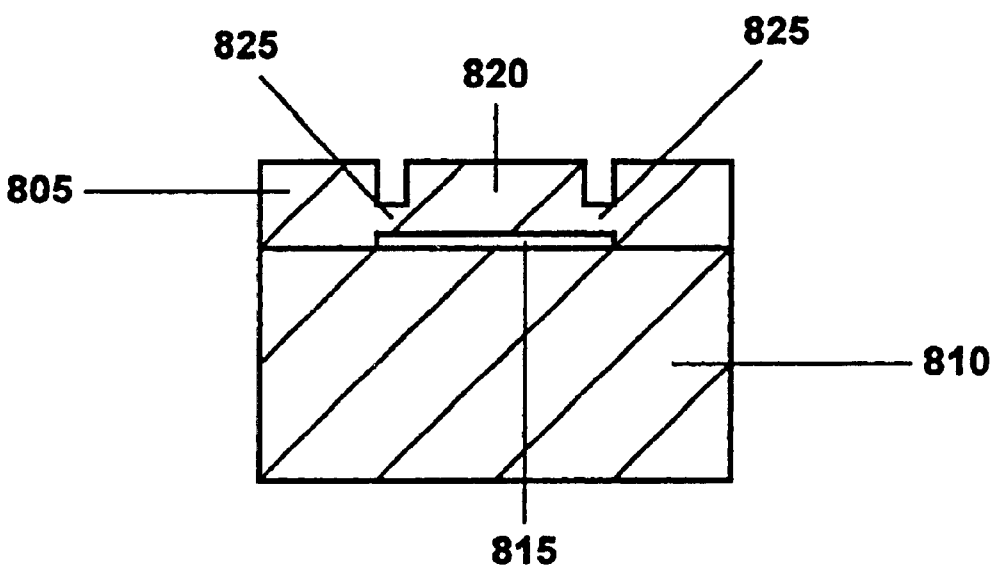
FIG. 8e is a cross sectional illustration of the top and bottom silicon wafers of FIG. 8d after micro machining the top silicon wafer to generate a micro machined structure that is coupled to the remaining portions of the top silicon wafer by one or more temporary bridges.

As illustrated in FIG. 8e, in a preferred embodiment, in step 725, a three dimensional structure 820 is micro machined in the top wafer 805 of silicon above the cavity 815 in the bottom surface of the top wafer 805 of silicon. In a preferred embodiment, the structure 820 is coupled to the remaining portions of the top wafer 805 of silicon by one or more temporary bridges 825.

In a preferred embodiment, the structure 820 and the temporary bridges 825 are formed using one or more of the merged-mask micro machining processes disclosed in U.S. utility patent application Ser. No. 09/352,025, attorney docket number 14737.659.3, filed on Jul. 13, 1999, the disclosure of which is incorporated herein by reference.

In a preferred embodiment, the structure 820 is coupled to the remaining portions of the top wafer 805 of silicon by the temporary bridges 825. The structure 820 is then preferably decoupled from the top wafer 805 of silicon by severing the temporary bridges 825. In this manner, the structure 820 is protected from damage prior to subsequent manufacturing operations. In an exemplary embodiment, the structure 820 is a strain gauge that is decoupled from the top wafer 805 of silicon and subsequently bonded to a substrate and wire bonded.

Figure 9:
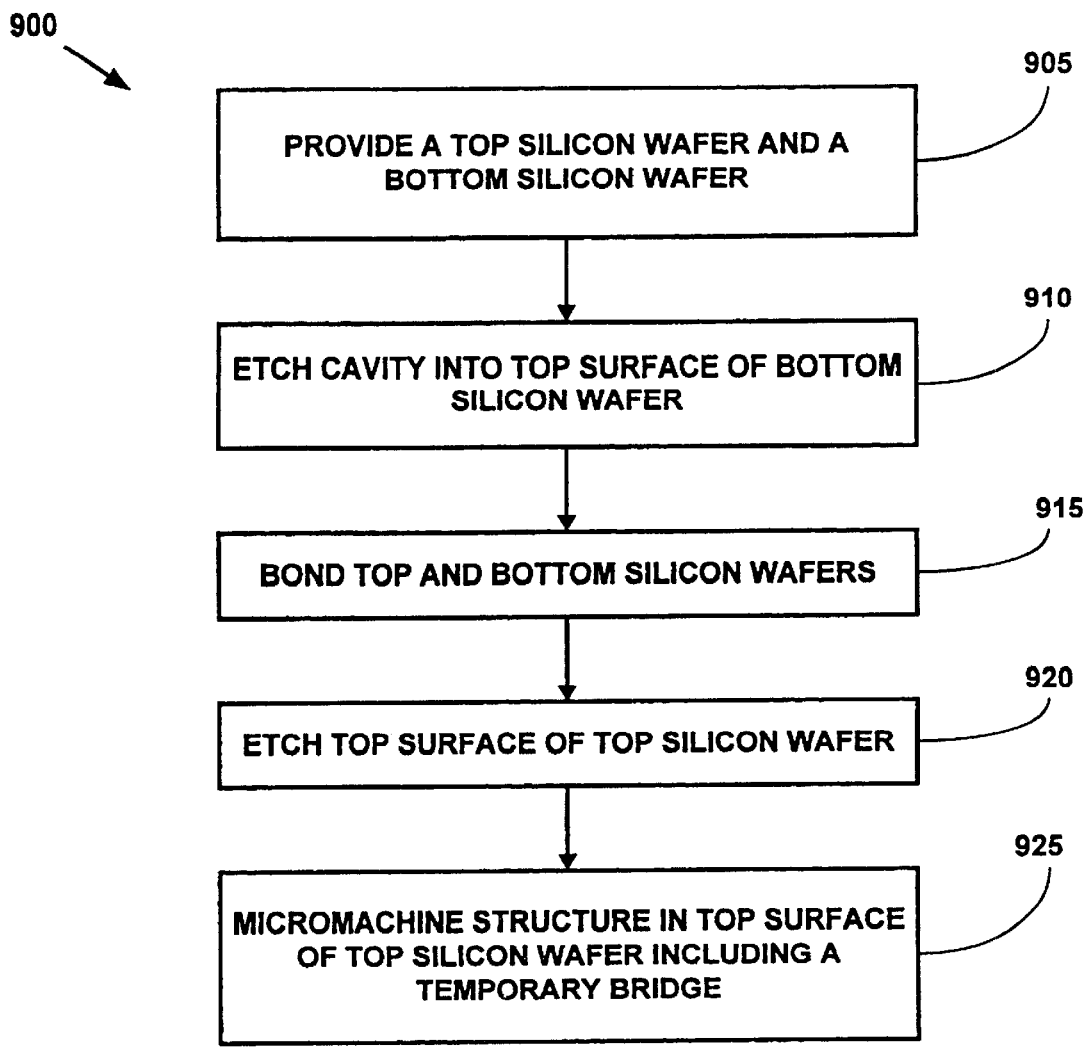
FIG. 9 is an illustration of another embodiment of a method for fabricating a micro machined structure coupled to a support structure using one or more temporary bridges.

Referring to FIG. 9, an alternative preferred embodiment of a method 900 for manufacturing a micro machined structure having one or more temporary bridges includes the steps of: (1) providing a top silicon wafer and a bottom silicon wafer in step 905; (2) etching one or more cavities in the top surface of the bottom silicon wafer in step 910; (3) bonding the top silicon wafer onto the bottom silicon wafer in step 915; (4) etching the top surface of the top silicon wafer in step 920; and (5) micro machining the top surface of the top silicon wafer to form a three dimensional structure including one or more temporary bridges in step 925.

Figure 10A:
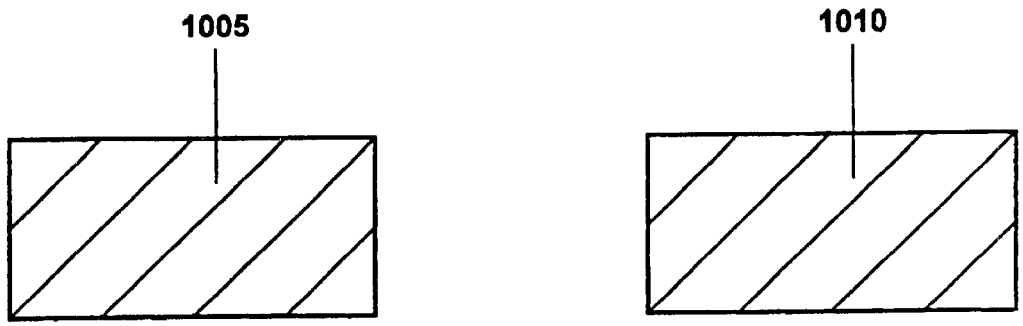
FIG. 10a is a cross sectional illustration of the fabrication of a top silicon wafer and a bottom silicon wafer.

As illustrated in FIG. 10a, in a preferred embodiment, in step 905, a top wafer 1005 of silicon and a bottom wafer 1010 of silicon are provided.

Figure 10B:
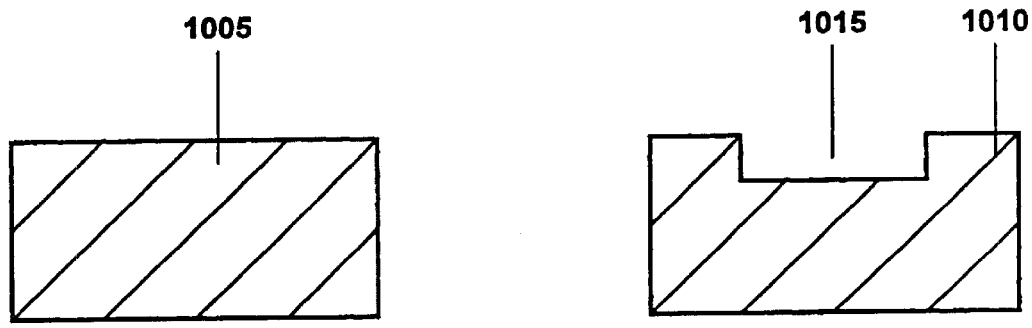
FIG. 10b. is a cross sectional illustration of the top and bottom silicon wafers of FIG. 10a after etching a cavity in the top surface of the bottom silicon wafer.

As illustrated in FIG. 10b, in a preferred embodiment, in step 910, a cavity 1015 is etched in the top surface of the bottom wafer 1005 of silicon. The cavity 1015 may have any number of cross-sectional shapes. In a preferred embodiment, the cavity 1015 has a substantially rectangular cross sectional shape.

Figure 10C:
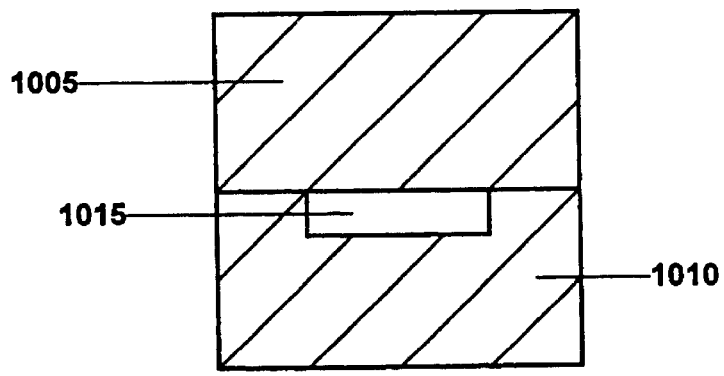
FIG. 10c is a cross sectional illustration of the top and bottom silicon wafers of FIG. 10b after bonding the top silicon wafer onto the bottom silicon wafer.

As illustrated in FIG. 10c, in a preferred embodiment, in step 915, the top wafer 1005 of silicon is bonded onto the bottom wafer 1010 of silicon. The top wafer 1005 of silicon may be bonded to the bottom wafer 1010 of silicon using any number of conventional processes for bonding wafers of silicon. In a preferred embodiment, the top wafer 1005 of silicon is bonded to the bottom wafer 1010 of silicon using the process of silicon fusion bonding.

Figure 10D:
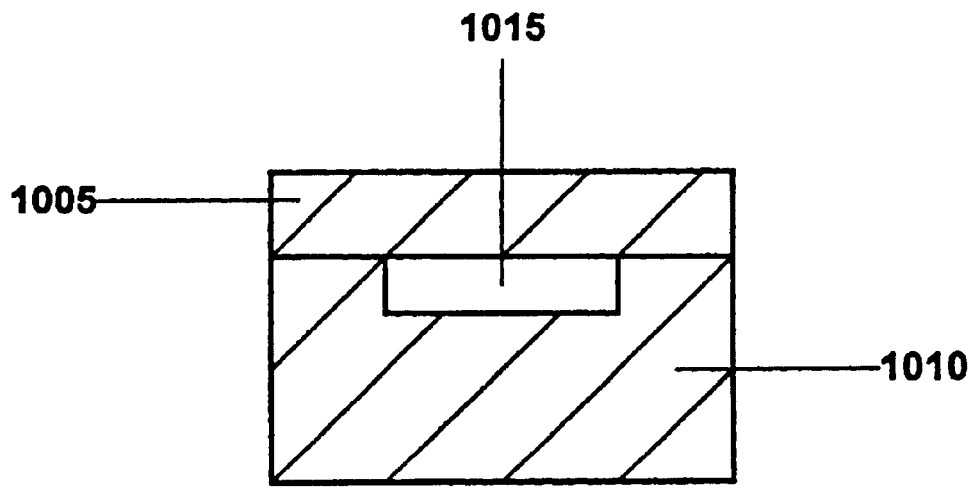
FIG. 10d is a cross sectional illustration of the top and bottom silicon wafers of FIG. 10c after etching the exposed portions of the top silicon wafer to a predetermined depth.

As illustrated in FIG. 10d, in a preferred embodiment, in step 920, the exposed portions of the top wafer 1005 are etched. In a preferred embodiment, the exposed portions of the top wafer 1005 of silicon are etched using a conventional wet etching process, dry etching process, or a wafer polishing process. In a preferred embodiment, the thickness of the top wafer 1005 of silicon above the cavity 1015 after the completion of the etching process ranges from about 5 to 50 microns.

Figure 10E:
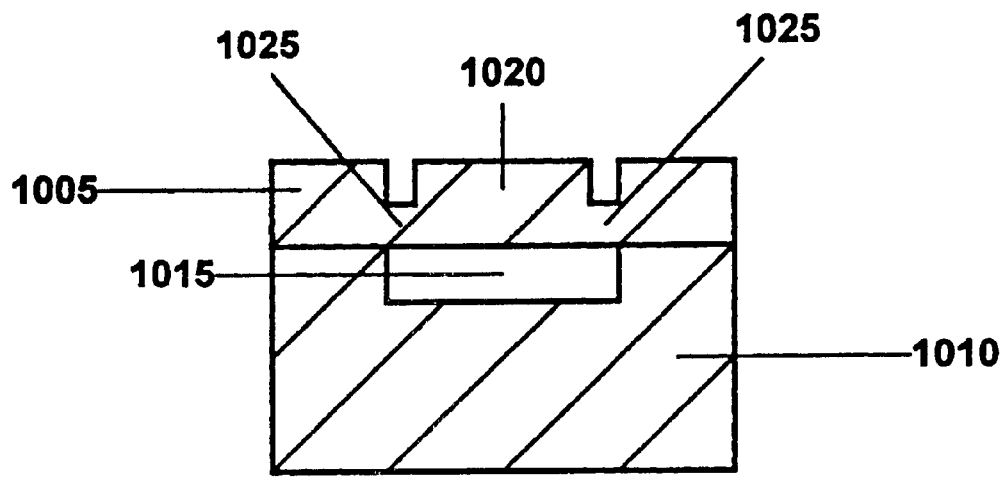
FIG. 10e is a cross sectional illustration of the top and bottom silicon wafers of FIG. 10d after micro machining the top silicon wafer to generate a micro machined structure that is coupled to the remaining portions of the top silicon wafer by one or more temporary bridges.

As illustrated in FIG. 10e, in a preferred embodiment, in step 925, a three dimensional structure 1020 is micro machined in the top wafer 1005 of silicon above the cavity 1015 in the bottom surface of the top wafer 1005 of silicon. In a preferred embodiment, the structure 1020 is coupled to the remaining portions of the top wafer 1005 of silicon by one or more temporary bridges 1025.

In a preferred embodiment, the structure 1020 and the temporary bridges 1025 are formed using one or more of the merged-mask micro machining processes disclosed in U.S. utility patent application Ser. No. 09/352,025, attorney docket number 14737.659.3, filed on Jul. 13, 1999, the disclosure of which is incorporated herein by reference.

In a preferred embodiment, the structure 1020 is coupled to the remaining portions of the top wafer 1005 of silicon by the temporary bridges 1025. The structure 1020 is then preferably decoupled from the top wafer 1005 of silicon by severing the temporary bridges 1025. In this manner, the structure 1020 is protected from damage prior to subsequent manufacturing operations. In an exemplary embodiment, the structure 1020 is a strain gauge that is decoupled from the top wafer 1005 of silicon and subsequently bonded to a substrate and wire bonded.

A micro machined apparatus has been described that includes a support structure, one or more temporary bridges coupled to the support structure, and a mass coupled to the temporary bridge. In a preferred embodiment, the thickness of the temporary bridges are less than the thicknesses of the support structure and the mass. In a preferred embodiment, the thickness of the temporary bridges are about 1 to 10% of the thicknesses of the support structure and the mass. In a preferred embodiment, the thickness of the temporary bridges range from about 5 to 50 microns. In a preferred embodiment, the temporary bridges include one or more cavities. In a preferred embodiment, the apparatus further includes one or more resilient couplings coupled to the support structure and the mass. In a preferred embodiment, the resilient couplings are T-shaped hinges. In a preferred embodiment, the support structure, resilient couplings, and mass are an accelerometer. In a preferred embodiment, the support structure, resilient couplings, and mass are a mirror assembly. In a preferred embodiment, the mass is a strain gauge.

A method of manufacturing a micro machined apparatus also has been described that includes micro machining a support structure coupled to a mass using one or more temporary bridges in a substrate and severing the temporary bridges. In a preferred embodiment, the mass is a strain gauge. In a preferred embodiment, the method further includes micro machining one or more resilient couplings in the substrate for coupling the mass to the support structure. In a preferred embodiment, the resilient couplings are T-shaped hinges.

A method of fabricating a micro machined structure also has been described that includes providing a top silicon wafer and a bottom silicon wafer, forming a cavity in the bottom surface of the top silicon wafer, bonding the top silicon wafer onto the bottom silicon wafer, etching a portion of the top surface of the top silicon wafer and micro machining a three dimensional structure in the portion of the top silicon wafer above the cavity having one or more temporary bridges for coupling the three dimensional structure to the remaining portions of the top silicon wafer. In a preferred embodiment, the method further includes severing the temporary bridges. In a preferred embodiment, the three dimensional structure comprises a strain gauge.

A method of fabricating a micro machined structure has also been described that includes providing a top silicon wafer and a bottom silicon wafer, forming a cavity in the top surface of the bottom silicon wafer, bonding the top silicon wafer onto the bottom silicon wafer, etching a portion of the top surface of the top silicon wafer and micro machining a three dimensional structure in the portion of the top silicon wafer above the cavity having one or more temporary bridges for coupling the three dimensional structure to the remaining portions of the top silicon wafer. In a preferred embodiment, the method further includes severing the temporary bridges. In a preferred embodiment, the three dimensional structure comprises a strain gauge.

A method of fabricating a micro machined structure also has been described that includes providing a top silicon wafer having an internal layer of silicon dioxide and a bottom silicon wafer, forming a cavity in the bottom surface of the top silicon wafer, bonding the top silicon wafer onto the bottom silicon wafer, etching a portion of the top surface of the top silicon wafer and micro machining a three dimensional structure in the portion of the top silicon wafer above the cavity having one or more temporary bridges for coupling the three dimensional structure to the remaining portions of the top silicon wafer. In a preferred embodiment, the method further includes severing the temporary bridges. In a preferred embodiment, the three dimensional structure is a strain gauge.

A method of fabricating a micro machined structure also has been described that includes providing a top silicon wafer having an internal layer of silicon dioxide and a bottom silicon wafer, forming a cavity in the top surface of the bottom silicon wafer, bonding the top silicon wafer onto the bottom silicon wafer, etching a portion of the top surface of the top silicon wafer and micro machining a three dimensional structure in the portion of the top silicon wafer above the cavity having one or more temporary bridges for coupling the three dimensional structure to the remaining portions of the top silicon wafer. In a preferred embodiment, the method further includes severing the temporary bridges. In a preferred embodiment, the three dimensional structure is a strain gauge.

A method of manufacturing a device including a micro machined structure also has been described that includes temporarily coupling the micro machined structure to a support structure using one or more temporary bridges, decoupling the micro machined structure from the support structure by severing the temporary bridges and coupling the micro machined structure to a substrate.

A method of protecting a resilient coupling for coupling a mass to a support structure also has been described that includes coupling the mass to the support structure using the resilient coupling and one or more temporary bridges and severing the temporary bridges.

As will be recognized by persons of ordinary skill in the art having the benefit of the present disclosure, multiple variations and modifications can be made in the embodiments of the invention. Although certain illustrative embodiments of the invention have been shown and described, a wide range of modifications, changes, and substitutions is contemplated in the foregoing disclosure. In some instances, some features of the present invention may be employed without a corresponding use of the other features. Accordingly, it is appropriate that the foregoing description be construed broadly and understood as being given by way of illustration and example only, the spirit and scope of the invention being limited only by the appended claims.

What is claimed is:

1. A method of fabricating a micro machined structure, comprising:
   providing a top silicon wafer and a bottom silicon wafer;
   forming a cavity in the bottom surface of the top silicon wafer; bonding the top silicon wafer onto the bottom silicon wafer;
   etching a portion of the top surface of the top silicon wafer;
   micro machining a three dimensional structure in the portion of the top silicon wafer above the cavity having one or more temporary bridges for coupling the three dimensional structure to the remaining portions of the top silicon wafer wherein the temporary bridges include a structural portion adapted for reduced severing force; and
   severing the temporary bridges.

2. The method of claim 1 wherein the three dimensional structure comprises a strain gauge.

3. The method of claim 1, wherein the structural portion includes at least one of a reduced thickness portion, a reduced width portion, a cavity, and a tapered portion.

4. A method of fabricating a micro machined structure, comprising:
   providing a top silicon wafer and a bottom silicon wafer;
   forming a cavity in the top surface of the bottom silicon wafer; bonding the top silicon wafer onto the bottom silicon wafer;
   etching a portion of the top surface of the top silicon wafer;
   micro machining a three dimensional structure in the portion of the top silicon wafer above the cavity having one or more temporary bridges for coupling the three dimensional structure to the remaining portions of the top silicon wafer wherein the temporary bridges include a structural portion adapted for reduced severing force; and
   severing the temporary bridges.

5. The method of claim 4, wherein the three dimensional structure comprises a strain gauge.

6. The method of claim 4, wherein the structural portion includes at least one of a reduced thickness portion, a reduced width portion, a cavity, and a tapered portion.

7. A method of fabricating a micro machined structure, comprising:
   providing a top silicon wafer having an internal layer of silicon dioxide and a bottom silicon wafer;
   forming a cavity in the bottom surface of the top silicon wafer; bonding the top silicon wafer onto the bottom silicon wafer;
   etching a portion of the top surface of the top silicon wafer;
   micro machining a three dimensional structure in the portion of the top silicon wafer above the cavity having one or more temporary bridges for coupling the three dimensional structure to the remaining portions of the top silicon wafer wherein the temporary bridges include a structural portion adapted for reduced severing force; and
   severing the temporary bridges.

8. The method of claim 7, wherein the three dimensional structure comprises a strain gauge.

9. The method of claim 7, wherein the structural portion includes at least one of a reduced thickness portion, a reduced width portion, a cavity, and a tapered portion.

10. A method of fabricating a micro machined structure, comprising:
    providing a top silicon wafer having an internal layer of silicon dioxide and a bottom silicon wafer;
    forming a cavity in the top surface of the bottom silicon wafer; bonding the top silicon wafer onto the bottom silicon wafer;
    etching a portion of the top surface of the top silicon wafer;

micro machining a three dimensional structure in the portion of the top silicon wafer above the cavity having one or more temporary bridges for coupling the three dimensional structure to the remaining portions of the top silicon wafer wherein the temporary bridges include a structural portion adapted for reduced severing force; and severing the temporary bridges.

11. The method of claim 10, wherein the three dimensional structure comprises a strain gauge.

12. The method of claim 10, wherein the structural portion includes at least one of a reduced thickness portion, a reduced width portion, a cavity, and a tapered portion.

* * * * *